(12) United States Patent
Kataoka et al.

(10) Patent No.: US 10,950,735 B2
(45) Date of Patent: Mar. 16, 2021

(54) SEMICONDUCTOR DEVICE

(71) Applicant: Toshiba Memory Corporation, Tokyo (JP)

(72) Inventors: Junji Kataoka, Kawasaki Kanagawa (JP); Tomomasa Ueda, Yokohama Kanagawa (JP); Tomoaki Sawabe, Tokyo (JP); Keiji Ikeda, Kawasaki Kanagawa (JP); Nobuyoshi Saito, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 21 days.

(21) Appl. No.: 16/351,245

(22) Filed: Mar. 12, 2019

(65) Prior Publication Data
US 2020/0013892 A1    Jan. 9, 2020

(30) Foreign Application Priority Data
Jul. 9, 2018   (JP) .............................. JP2018-129946

(51) Int. Cl.
*H01L 29/786* (2006.01)
*H01L 45/00* (2006.01)
*H01L 29/24* (2006.01)

(52) U.S. Cl.
CPC .......... *H01L 29/7869* (2013.01); *H01L 29/24* (2013.01); *H01L 45/06* (2013.01); *H01L 45/147* (2013.01)

(58) Field of Classification Search
CPC ............. H01L 29/7869; H01L 2445/06; H01L 2445/147

USPC ........................................................... 257/43
See application file for complete search history.

(56) References Cited

U.S. PATENT DOCUMENTS

| | | | |
|---|---|---|---|
| 9,324,875 B2 | 4/2016 | Yamazaki | |
| 9,698,227 B2 | 7/2017 | Ng | |
| 9,761,737 B2 | 9/2017 | Tanaka | |
| 2012/0319112 A1 | 12/2012 | Cho | |
| 2014/0034946 A1* | 2/2014 | Yamazaki | H01L 29/42356 257/43 |
| 2014/0252345 A1* | 9/2014 | Tsubuku | H01L 21/02488 257/43 |

(Continued)

FOREIGN PATENT DOCUMENTS

| | | |
|---|---|---|
| JP | 2007-150158 A | 6/2007 |
| JP | 2013-4958 A | 1/2013 |
| JP | 5250929 B2 | 7/2013 |

(Continued)

*Primary Examiner* — Andy Huynh
(74) *Attorney, Agent, or Firm* — Foley & Lardner LLP

(57) ABSTRACT

According to one embodiment, a semiconductor device includes a semiconductor layer and a first layer. The semiconductor layer includes a first portion including a first element and oxygen. The first element includes at least one selected from the group consisting of In, Ga, Zn, Al, Sn, Ti, Si, Ge, Cu, As, and W. The first layer includes a second element including at least one selected from the group consisting of W, Ti, Ta, Mo, Cu, Al, Ag, Hf, Au, Pt, Pd, Ru, Y, V, Cr, Ni, Nb, In, Ga, Zn, and Sn. The first portion includes a first region and a second region. The second region is provided between the first region and the first layer. The first region includes a bond of the first element and oxygen. The second region includes a bond of the first element and a metallic element.

21 Claims, 8 Drawing Sheets

(56) References Cited

U.S. PATENT DOCUMENTS

2016/0190174 A1 6/2016 Umezaki
2016/0218224 A1 7/2016 Ota

FOREIGN PATENT DOCUMENTS

JP         5352391 B1   11/2013
JP    2016-134578 A   7/2016

* cited by examiner

SEMICONDUCTOR DEVICE

CROSS-REFERENCE TO RELATED APPLICATIONS

This application is based upon and claims the benefit of priority from Japanese Patent Application No. 2018-129946, filed on Jul. 9, 2018; the entire contents of which are incorporated herein by reference.

FIELD

Embodiments described herein relate generally to a semiconductor device.

BACKGROUND

For example, there is a semiconductor device that includes an oxide semiconductor including indium, gallium, and zinc. It is desirable to improve the characteristics of the semiconductor device.

DETAILED DESCRIPTION

Figure 1:
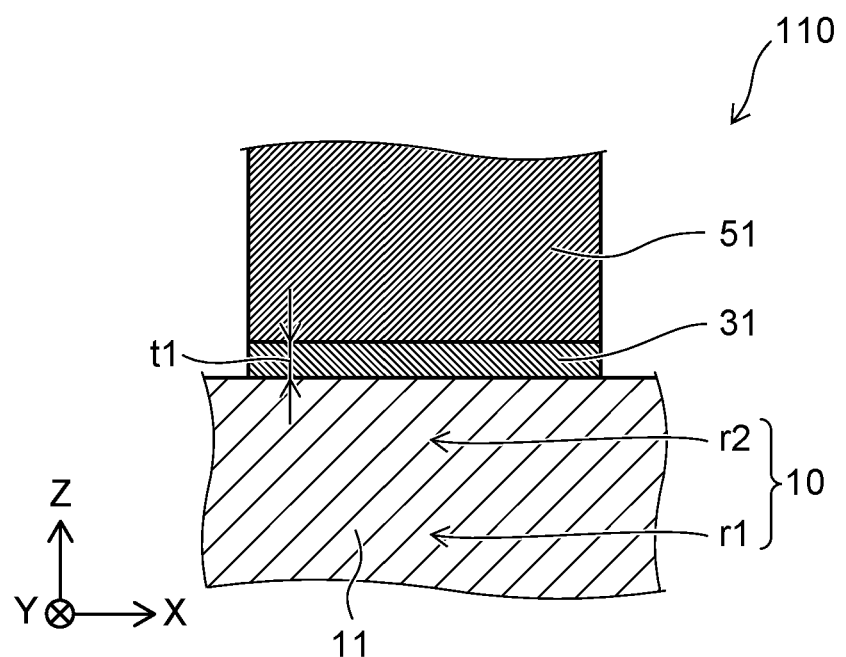
FIG. 1 is a schematic cross-sectional view illustrating a semiconductor device according to a first embodiment.

According to one embodiment, a semiconductor device includes a semiconductor layer and a first layer. The semiconductor layer includes a first portion including a first element and oxygen. The first element includes at least one selected from the group consisting of In, Ga, Zn, Al, Sn, Ti, Si, Ge, Cu, As, and W. The first layer includes a second element including at least one selected from the group consisting of W, Ti, Ta, Mo, Cu, Al, Ag, Hf, Au, Pt, Pd, Ru, Y, V, Cr, Ni, Nb, In, Ga, Zn, and Sn. The first portion includes a first region and a second region. The second region is provided between the first region and the first layer. The first region includes a bond of the first element and oxygen. The second region includes a bond of the first element and a metallic element. A thickness of the first layer along a first direction is not less than 0.5 nm but less than 3 nm. The first direction is from the first portion toward the first layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a semiconductor layer 10 and a first layer 31. A first electrode 51 is further provided in the example.

The semiconductor layer 10 includes a first element and oxygen. The first element includes at least one selected from the group consisting of In, Ga, Zn, Al, Sn, Ti, Si, Ge, Cu, As, and W. The first element may include multiple types of elements. In one example, the first element includes In, Ga, and Zn. In such a case, the semiconductor layer 10 includes, for example, InGaZnO. The semiconductor layer 10 includes, for example, an oxide semiconductor. The semiconductor layer 10 includes at least a first portion 11. As described below, the semiconductor layer 10 may further include other portions.

The first layer 31 includes a second element. The second element includes, for example, at least one selected from the group consisting of W, Ti, Ta, Mo, Cu, Al, Ag, Hf, Au, Pt, Pd, Ru, Y, V, Cr, Ni, Nb, In, Ga, Zn, and Sn. The second element is, for example, W. In such a case, the first layer 31 includes W. In such a case, the first layer 31 is, for example, a W film. As described below, the first layer 31 may include oxygen in addition to the second element.

The direction from the first portion 11 of the semiconductor layer 10 toward the first layer 31 is taken as a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

For example, the first layer 31 spreads along the X-Y plane. For example, the semiconductor layer 10 spreads along the X-Y plane.

For example, in the case where the first electrode 51 is provided, the first layer 31 is provided between the first portion 11 and the first electrode 51 in the first direction (the Z-axis direction).

For example, the first electrode 51 includes at least one selected from the group consisting of a first oxide, Au, Pt, and Pd. The first oxide recited above includes an oxide including at least one element selected from the group consisting of In, Sn, Zn, and Ti. In one example, the first electrode 51 includes ITO (Indium Tin Oxide). In another example, the first electrode 51 may include Au, etc.

In the embodiment, a distribution is provided in the states of the bonds of the first element in the first portion 11 of the semiconductor layer 10.

For example, the first portion 11 includes a first region r1 and a second region r2. The second region r2 is provided between the first region r1 and the first layer 31. In one example, the second region r2 contacts the first layer 31.

The first region r1 includes a bond of the first element and oxygen. The second region r2 includes a bond of the first element and a metallic element. For example, the bond of the first element and the metallic element includes a bond of the first element and the first element. The second region r2 may include a bond of the first element and oxygen.

In one example, in the case where the semiconductor layer 10 includes InGaZnO, the first element includes In. In such a case, the first region r1 includes a bond of In and oxygen. In such a case, the second region r2 includes a bond of In and a metallic element. For example, the second region r2 includes a bond of In and In. The second region r2 may further include a bond of In and oxygen.

In the case where the semiconductor layer 10 includes InGaZnO, the first element includes Ga. In such a case, the first region r1 includes a bond of Ga and oxygen. In such a case, the second region r2 includes a bond of Ga and a metallic element. For example, the second region r2 includes a bond of Ga and Ga. The second region r2 may further include a bond of Ga and oxygen.

For example, the second region r2 may include an In—Ga bond. The second region r2 may include an In—Zn bond. The second region r2 may include a Ga—Zn bond.

For example, the concentration of oxygen in the second region r2 is lower than the concentration of oxygen in the first region r1.

For example, the conductivity of the second region r2 is lower than the conductivity of the first region r1.

According to the embodiment, for example, good contact properties are obtained between the first layer 31 and the semiconductor layer 10 (in the example, the first portion 11). For example, good ohmic contact characteristics are obtained between the first electrode 51 and the semiconductor layer 10 (in the example, the first portion 11). For example, a low electrical resistance is obtained. According to the embodiment, a semiconductor device can be provided in which the contact resistance can be reduced. According to the embodiment, a semiconductor device can be provided in which the characteristics can be improved.

For example, the first layer 31 causes reduction of the first element included in the first portion 11 of the semiconductor layer 10. Thereby, the bond of the first element and the first element occurs easily. For example, an In—In bond occurs. Thereby, the resistance of a portion (the second region r2) including the In—In bond can be low locally. It is considered that a good contact property is obtained thereby.

In one example according to the embodiment, a thickness t1 of the first layer 31 (referring to FIG. 1) is, for example, not less than 0.5 nm and not more than 5 nm. The thickness t1 may be, for example, not less than 0.5 nm but less than 3 nm. By setting the thickness t1 to be thin, excessive spreading of the region (the second region r2) where reduction of the first element occurs can be suppressed.

For example, the second region r2 spreads excessively in the case where the thickness t1 is excessively thick. For example, cases occur where the second region r2 includes a portion not overlapping the first layer 31 in the Z-axis direction. For example, the second region r2 includes a portion not overlapping the first electrode 51 in the Z-axis direction. In such cases, a region where the resistance in the lateral direction (a direction along the X-Y plane) is low spreads excessively. In such cases, if the embodiment is applied to a transistor, etc., negative effects on the effective channel length may occur. For example, in the case where the embodiment is applied to a select switch (e.g., a non-linear element), etc., there is a possibility that the resistance may be low in a region other than the desired region; and the desired operation may be obtained easily.

In the embodiment, the excessive spreading of the low-resistance region can be suppressed by appropriately setting the thickness t1.

As recited above, the second region r2 may contact the first layer 31. The thickness in the first direction (the thickness along the Z-axis direction) of the second region r2 may be the thickness t1 of the first layer 31 or less. The thickness in the first direction (the thickness along the Z-axis direction) of the second region r2 may be 2 times the thickness t1 of the first layer 31 or less.

On the other hand, the first region r1 is separated from the first layer 31. In one example, the distance along the Z-axis direction between the first region r1 and the first layer 31 may be, for example, 10 times the thickness t1 or more. For example, in the case where the thickness t1 is 2 nm, the distance along the Z-axis direction between the first region r1 and the first layer 31 may be 20 nm or more. The distance along the Z-axis direction between the first region r1 and the first layer 31 may be, for example, 100 times the thickness t1 or less. The characteristics at positions such as those recited above may be verified when verifying the bonds of the elements such as those recited above.

An example of analysis results of the states of the elements in the semiconductor layer 10 will now be described. In a first sample described below, the semiconductor layer 10 is InGaZnO. The first layer 31 is a W film having a thickness of 2 nm. The first electrode 51 is ITO. On the other hand, in a second sample, the first layer 31 is not provided. In the second sample, the semiconductor layer 10 (the InGaZnO film) and the first electrode 51 (the ITO film) contact each other.

FIG. 2A to FIG. 2D are graphs illustrating the analysis results of the semiconductor device.

Figure 2A:
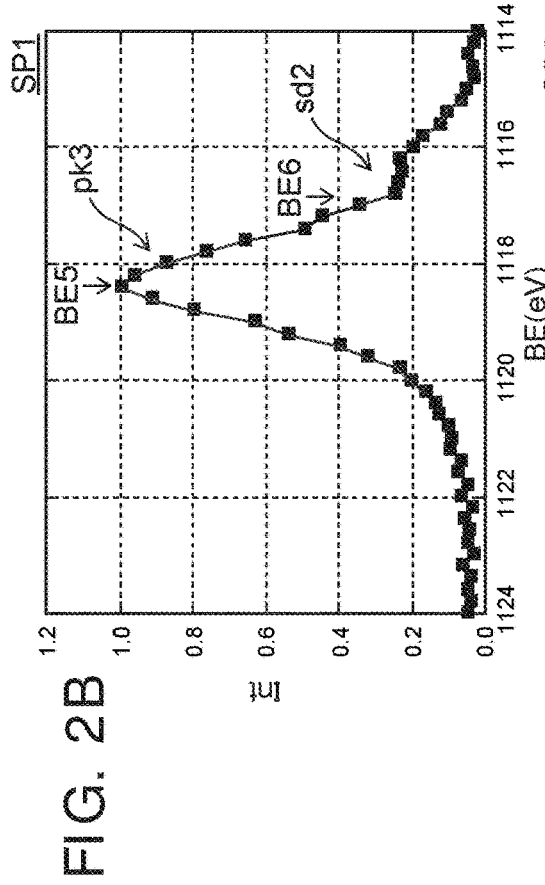
FIG. 2A to FIG. 2D are graphs illustrating the analysis results of the semiconductor device.
Figure 2B:
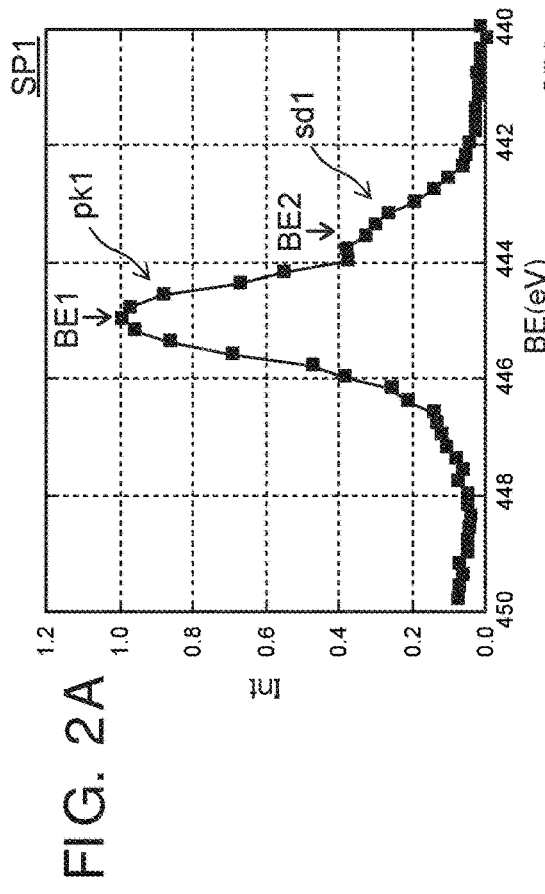
Figure 2C:
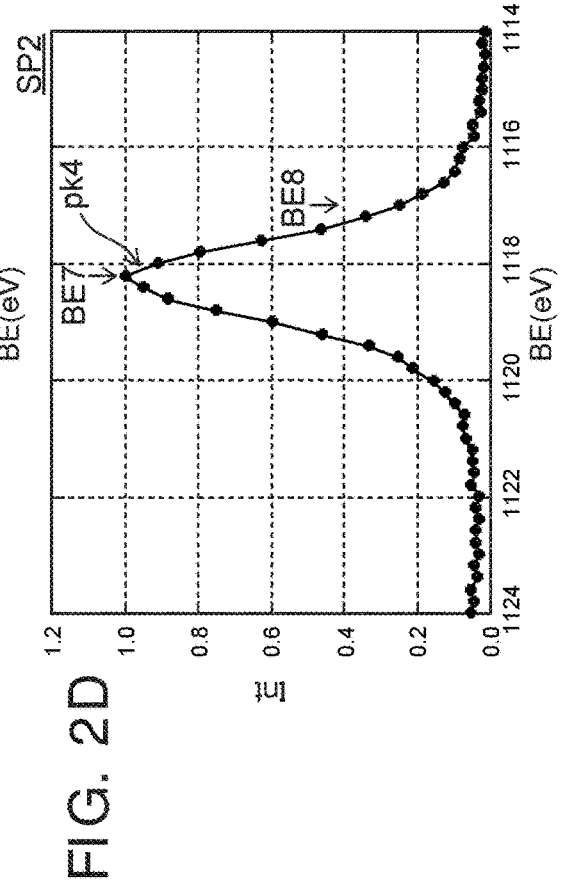
Figure 2D:
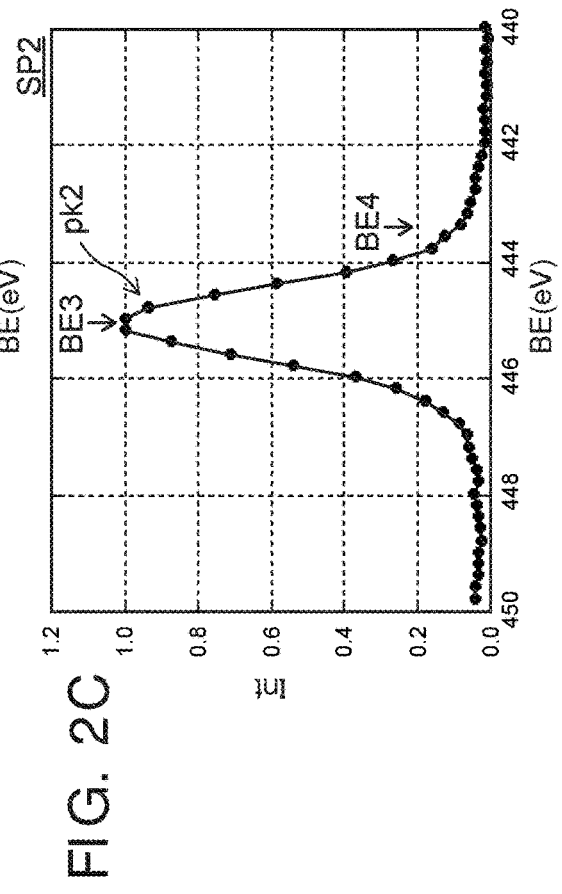

FIG. 2A and FIG. 2B correspond to the first sample SP1 recited above. FIG. 2C and FIG. 2D correspond to the second sample SP2 recited above. These figures illustrate the results of X-ray photoelectron spectroscopy (XPS) of these samples. The XPS analysis is performed for the two types of samples recited above in a state in which a portion of the first electrode 51 having a thickness of 2 nm remains and the other portions are removed. FIG. 2A to FIG. 2D correspond to characteristics of the front surface portion of the semiconductor layer 10. The front surface portion corresponds to the second region r2 recited above.

The horizontal axis of these figures corresponds to a binding energy BE (eV). The vertical axis of these figures corresponds to an intensity Int (arbitrary units) of the signal obtained. FIG. 2A and FIG. 2C correspond to the state of $In3d_{5/2}$. FIG. 2B and FIG. 2D correspond to the state of $Ga2p_{3/2}$.

In the first sample SP1 as shown in FIG. 2A, a first peak pk1 is observed in the region where the binding energy BE is not less than 440 eV and not more than 450 eV (in the example, not less than 444 eV and not more than 446 eV, which may be not less than 444.5 eV and not more than 445.5 eV). The first peak pk1 corresponds to an In—O bond. Further, a shoulder sd1 is observed in the intensity Int of the signal at the vicinity of a binding energy of 443.3 eV. The shoulder sd1 corresponds to a bond of In and a metallic element (e.g., an In—In bond).

In the second sample SP2 as shown in FIG. 2C as well, a second peak pk2 is observed in the region where the binding energy BE is not less than 440 eV and not more than 450 eV (in the example, not less than 444 eV and not more than 446 eV, which may be not less than 444.5 eV and not more than 445.5 eV). The second peak pk2 corresponds to an In—O bond. In the second sample SP2, the shoulder sd1 is not observed at the vicinity of a binding energy of 443.3 eV.

Thus, the first sample SP1 includes an In—O bond and an In-metallic element bond. Conversely, the second sample SP2 includes an In—O bond but substantially does not include an In-metallic element bond.

In the first sample SP1, the first layer (the W film) is provided on the semiconductor layer 10. It is considered that because W is included in the first layer 31, reduction of the front surface portion of the semiconductor layer 10 occurs; and the In-metallic element bond occurs from the In—O bond. On the other hand, it is considered that because the W film is not provided in the second sample SP2, reduction of the semiconductor layer 10 does not occur; and the In-metallic element bond substantially does not occur.

On the other hand, in the first sample SP1 as shown in FIG. 2B, a third peak pk3 is observed in the region where the binding energy BE is not less than 1114 eV and not more than 1123 eV (in the example, not less than 1118 eV and not more than 1119 eV, which may be not less than 1117.5 eV and not more than 1119.5 eV). The third peak pk3 corresponds to a Ga—O bond. Further, a shoulder sd2 is observed in the intensity Int of the signal at the vicinity of a binding energy BE of 1116 eV. The shoulder sd2 corresponds to a bond of Ga and a metallic element (e.g., a Ga—Ga bond).

In the second sample SP2 as shown in FIG. 2D, a fourth peak pk4 is observed in the region where the binding energy BE is not less than 1114 eV and not more than 1123 eV (in the example, not less than 1118 eV and not more than 1119 eV, which may be not less than 1117.5 eV and not more than 1119.5 eV). The fourth peak pk4 corresponds to a Ga—O bond. In the second sample SP2, the shoulder sd2 is not observed at the vicinity of a binding energy BE of 1116 eV.

Thus, the first sample SP1 includes the Ga—O bond and the Ga-metallic element bond. Conversely, the second sample SP2 includes the Ga—O bond but substantially does not include a Ga-metallic element bond. It is considered that because the W is included in the first layer 31 in the first sample SP1, reduction of the front surface portion of the semiconductor layer 10 occurs; and the Ga-metallic element bond occurs from the Ga—O bond. On the other hand, it is considered that because a W film is not provided in the second sample SP2, reduction of the semiconductor layer 10 does not occur; and a Ga-metallic element bond substantially does not occur.

The first region r1 that is separated from the first layer 31 substantially is not affected by the first layer 31 and has characteristics corresponding to the characteristics of the second sample SP2.

In the embodiment, for example, the first element includes In. In such a case, a first signal obtained by the X-ray photoelectron spectroscopy of the second region r2 (corresponding to the first sample SP1) includes the first peak pk1 at a first binding energy BE1. The first signal at a second binding energy BE2 is 20% or more of the intensity of the first peak pk1. The first binding energy BE1 is not less than 440 eV and not more than 450 eV. The first binding energy BE1 may be not less than 444 eV and not more than 446 eV. The first binding energy BE1 may be not less than 444.5 eV and not more than 445.5 eV. The second binding energy BE2 is lower than the first binding energy BE1. The absolute value of the difference between the first binding energy BE1 and the second binding energy BE2 is 1.5 eV. The first signal at the second binding energy BE2 corresponds to the shoulder sd1 recited above. The second binding energy BE2 is, for example, 443.3 eV.

On the other hand, a second signal obtained by the X-ray photoelectron spectroscopy of the first region r1 (corresponding to the second sample SP2) includes the second peak pk2 at a third binding energy BE3 (referring to FIG. 2C). The second signal at a fourth binding energy BE4 is less than 20% of the intensity of the second peak pk2 (referring to FIG. 2C). The third binding energy BE3 is not less than 440 eV and not more than 450 eV. The first binding energy BE1 may be not less than 444 eV and not more than 446 eV. The first binding energy BE1 may be not less than 444.5 eV and not more than 445.5 eV. The fourth binding energy BE4 is lower than the third binding energy BE3. The absolute value of the difference between the third binding energy BE3 and the fourth binding energy BE4 is 1.5 eV (referring to FIG. 2C). The shoulder sd1 substantially does not occur at the fourth binding energy BE4 (substantially corresponding to the second binding energy BE2) in the first region r1. The fourth binding energy BE4 is, for example, 443.3 eV.

In the embodiment, for example, the first element includes Ga. In such a case, a third signal that is obtained by the X-ray photoelectron spectroscopy of the second region r2 (corresponding to the first sample SP1) includes the third peak pk3 at a fifth binding energy 13E5 (referring to FIG. 2B). The third signal at a sixth binding energy BE6 is 20% or more of the intensity of the third peak pk3. The fifth binding energy 13E5 is not less than 1114 eV and not more than 1123 eV. The fifth binding energy 13E5 may be not less than 1118 eV and not more than 1119 eV. The fifth binding energy BE5 may be not less than 1117.5 eV and not more than 1119.5 eV. The sixth binding energy BE6 is lower than the fifth binding energy 13E5. The absolute value of the difference between the fifth binding energy 13E5 and the sixth binding energy BE6 is 2.0 eV. The third signal at the sixth binding energy BE6 corresponds to the shoulder sd2 recited above. The sixth binding energy BE6 is, for example, 1116 eV.

On the other hand, a fourth signal that is obtained by the X-ray photoelectron spectroscopy of the first region r1 (corresponding to the second sample SP2) includes the fourth peak pk4 at a seventh binding energy BE7 (referring to FIG. 2D). The fourth signal at an eighth binding energy BE8 is less than 20% of the intensity of the fourth peak pk4 (referring to FIG. 2D). The seventh binding energy BE7 is not less than 1114 eV and not more than 1123 eV. The seventh binding energy BE7 may be not less than 1118 eV and not more than 1119 eV. The seventh binding energy BE7 may be not less than 1117.5 eV and not more than 1119.5 eV. The eighth binding energy BE8 is lower than the seventh binding energy BE7. The absolute value of the difference between the seventh binding energy BE7 and the eighth binding energy BE8 is 2.0 eV (referring to FIG. 2D). The shoulder sd2 substantially does not occur at the eighth binding energy BE8 (substantially corresponding to the sixth binding energy BE6) in the first region r1. The eighth binding energy BE8 is, for example, 1116 eV.

For example, in the X-ray photoelectron spectroscopy of the second region r2 in the case where the first element includes In, the signal strength at a binding energy of 443.3 eV is 20% or more of the signal strength at a binding energy of 445 eV. In the X-ray photoelectron spectroscopy of the first region r1, the signal strength at a binding energy of 443.3 eV is less than 20% of the signal strength at a binding energy of 445 eV.

For example, in the X-ray photoelectron spectroscopy of the second region r2 in the case where the first element includes Ga, the signal strength at a binding energy of 1116.2 eV is 20% or more of the signal strength at a binding energy of 1118.5 eV. In the X-ray photoelectron spectroscopy of the first region r1, the signal strength at a binding energy of 1116.2 eV is less than 20% of the signal strength at a binding energy of 1118.5 eV.

For example, good contact characteristics are obtained due to such characteristics. Good ohmic contact characteristics are obtained. For example, a semiconductor device can be provided in which the contact resistance can be reduced further. For example, a semiconductor device can be provided in which the characteristics can be improved.

In the embodiment, it is favorable for the binding energy of the second element included in the first layer 31 with oxygen to be higher than the binding energy of the first element included in the semiconductor layer 10 with oxygen. Thereby, reduction of the front surface portion of the semiconductor layer 10 occurs easily due to the second element.

Second Embodiment

A second embodiment relates to a transistor.

Figure 3:
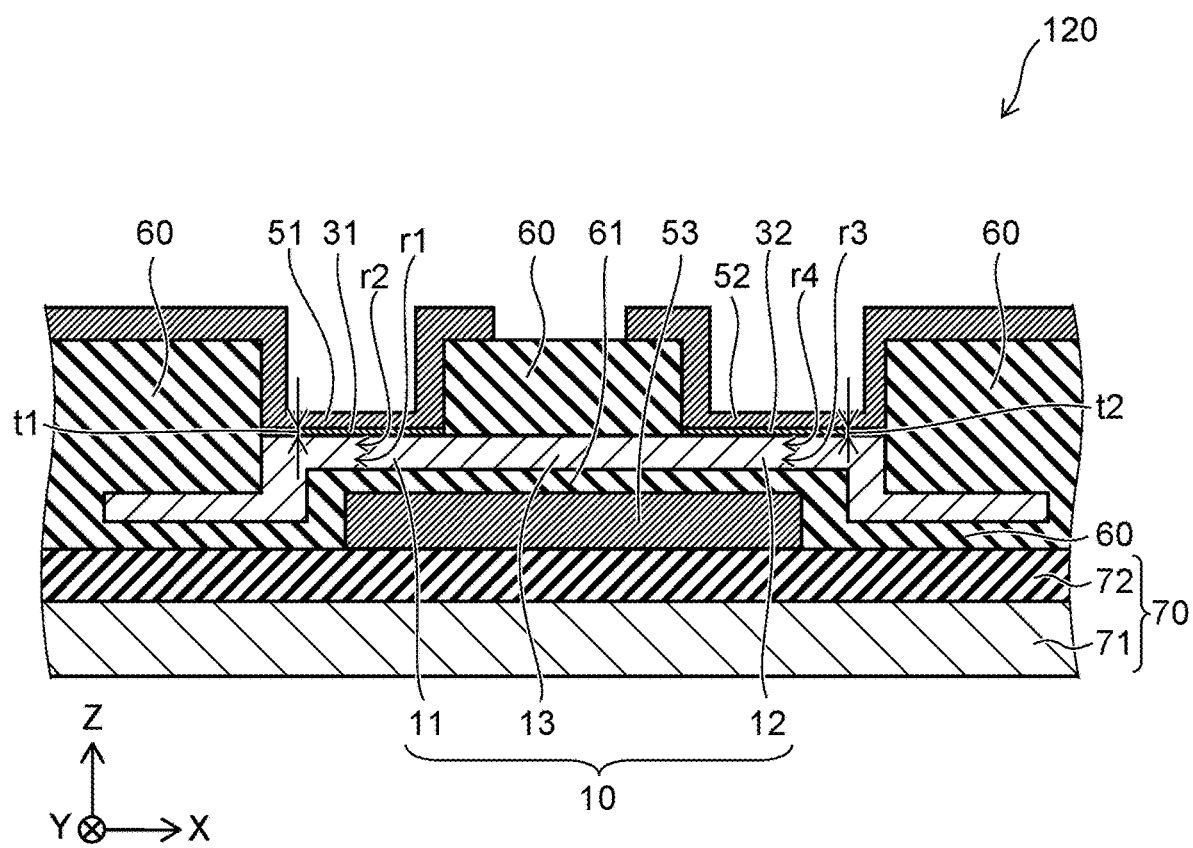
FIG. 3 is a schematic cross-sectional view illustrating the semiconductor device according to the second embodiment.

FIG. 3 is a schematic cross-sectional view illustrating the semiconductor device according to the second embodiment.

As shown in FIG. 3, the semiconductor device 120 further includes a second layer 32, a second electrode 52, a third electrode 53, and an insulating portion 60 in addition to the semiconductor layer 10, the first layer 31, and the first electrode 51. The insulating portion 60 includes a first insulating region 61.

A second direction from the first electrode 51 toward the second electrode 52 crosses the first direction (the Z-axis direction). In the example, the second direction corresponds to the X-axis direction.

The position in the second direction (e.g., the X-axis direction) of at least a portion of the third electrode 53 is between the position in the second direction of at least a portion of the first electrode 51 and the position in the second direction of at least a portion of the second electrode 52.

The semiconductor layer 10 further includes a second portion 12 and a third portion 13 in addition to the first portion 11. The direction from the first portion 11 toward the second portion 12 is aligned with the second direction (e.g., the X-axis direction).

The second layer 32 is provided between the second portion 12 and the second electrode 52 in the first direction (the Z-axis direction).

The third portion 13 is provided between the first portion 11 and the second portion 12. The first portion 11 of the semiconductor layer 10 is, for example, a portion corresponding to the first layer 31 (and the first electrode 51). The second portion 12 of the semiconductor layer 10 is, for example, a portion corresponding to the second layer 32 (and the second electrode 52). The third portion 13 is, for example, a portion corresponding to the third electrode 53.

The first insulating region 61 is between the third electrode 53 and the third portion 13 in the first direction (the Z-axis direction).

The first electrode 51 is, for example, a source electrode. The first portion 11 is a source region. The first layer 31 is, for example, a source contact region. The second electrode 52 is, for example, a drain electrode. The second portion 12 is a drain region. The second layer 32 is, for example, a drain contact region. The third electrode 53 is, for example, a gate electrode. The first insulating region 61 is, for example, a gate insulating film. The semiconductor device 120 is, for example, a transistor.

A base body 70 is provided in the example. In the example, the base body 70 includes a substrate 71 (e.g., a silicon substrate) and an insulating film 72. The insulating film 72 is, for example, a silicon oxide film (e.g., a thermal oxide film).

In the example, the semiconductor layer 10 is provided between the base body 70 and the first electrode 51 and between the base body 70 and the second electrode 52. The insulating film 72 is provided between the substrate 71 and the semiconductor layer 10.

In the example, the third electrode 53 is provided between the semiconductor layer 10 and the base body 70. For example, the position in the first direction (the Z-axis direction) of the first portion 11 of the semiconductor layer 10 is between the position in the first direction of the third electrode 53 and the position in the first direction of the first layer 31. In the example, for example, the semiconductor device 120 is a bottom-gate transistor. The semiconductor device 120 may be a top-gate transistor.

The second layer 32 includes, for example, at least one selected from the group consisting of W, Ti, Ta, Mo, Cu, Al, Ag, Hf, Au, Pt, Pd, Ru, Y, V, Cr, Ni, Nb, In, Ga, Zn, and Sn. The material of the second layer 32 may be the same as the material of the first layer 31.

The second electrode 52 includes at least one selected from the group consisting of a second oxide, Au, Pt, and Pd. The second oxide includes an oxide including at least one element selected from the group consisting of In, Sn, Zn, and Ti. The material of the second electrode 52 may be the same as the material of the first electrode 51.

In the semiconductor device 120 as well, for example, the first region r1 includes a bond of the first element and oxygen. The second region r2 includes a bond of the first element and a metallic element (e.g., a bond of the first element and the first element). Thereby, good contact characteristics are obtained between the first portion 11 and the first electrode 51.

On the other hand, the second portion 12 includes a third region r3 and a fourth region r4. The fourth region r4 is provided between the third region r3 and the second layer 32. The third region r3 includes a bond of the first element and oxygen. The fourth region r4 includes a bond of the first element and a metallic element (e.g., a bond of the first element and the first element). Thereby, good contact characteristics are obtained between the second portion 12 and the second electrode 52.

A thickness t2 of the second layer 32 along the first direction (the Z-axis direction) recited above (referring to FIG. 3) is, for example, not less than 0.5 nm and not more than 5 nm. The thickness t2 may be the thickness of the second layer 32 along the direction from the second portion 12 toward the second layer 32. The thickness t2 may be, for example, not less than 0.5 nm but less than 3 nm. For example, the thickness t2 may be the same as the thickness t1. By setting the second layer 32 to be thin, the excessive spreading of the low-resistance region can be suppressed. For example, there are cases where the channel length of the transistor is reduced when the low-resistance region spreads. By setting the second layer 32 to be thin, the excessive spreading of the low-resistance region is suppressed; and the reduction of the channel length can be suppressed.

In the semiconductor device 120, the characteristics of the third region r3 and the fourth region r4 respectively may be substantially the same as the characteristics of the first region r1 and the second region r2.

In the semiconductor device 120, the characteristics of the third portion 13 may be substantially the same as the characteristics of the first region r1 of the first portion 11. For example, at least a portion of the first portion 11 includes a bond of the first element and oxygen. The third portion 13 includes a bond of the first element and a metallic element.

In the embodiment, for example, the first element includes In. In such a case, the first signal obtained by X-ray photoelectron spectroscopy of at least a portion of the first portion 11 includes the first peak pk1 at the first binding energy BE1. The first signal at the second binding energy BE2 is 20% or more of the intensity of the first peak pk1. The first binding energy BE1 is not less than 440 eV and not more than 450 eV. The first binding energy BE1 may be not less than 444 eV and not more than 446 eV. The first binding energy BE1 may be not less than 444.5 eV and not more than 445.5 eV. The second binding energy BE2 is lower than the first binding energy BE1. The absolute value of the difference between the first binding energy BE1 and the second binding energy BE2 is 1.5 eV.

On the other hand, the second signal that is obtained by X-ray photoelectron spectroscopy of the third portion 13 includes the second peak pk2 at the third binding energy BE3. The second signal at the fourth binding energy BE4 is less than 20% of the intensity of the second peak pk2. The third binding energy BE3 is not less than 440 eV and not more than 450 eV. The first binding energy BE1 may be not less than 444 eV and not more than 446 eV. The first binding energy BE1 may be not less than 444.5 eV and not more than 445.5 eV. The fourth binding energy BE4 is lower than the third binding energy BE3. The absolute value of the difference between the third binding energy BE3 and the fourth binding energy BE4 is 1.5 eV.

In the embodiment, for example, the first element includes Ga. In such a case, the third signal that is obtained by the X-ray photoelectron spectroscopy of at least a portion of the first portion 11 includes the third peak pk3 at the fifth binding energy BE5. The third signal at the sixth binding energy BE6 is 20% or more of the intensity of the third peak pk3. The fifth binding energy 13E5 is not less than 1114 eV and not more than 1123 eV. The fifth binding energy BE5 may be not less than 1118 eV and not more than 1119 eV. The fifth binding energy BE5 may be not less than 1117.5 eV and not more than 1119.5 eV. The sixth binding energy BE6 is lower than the fifth binding energy BE5. The absolute value of the difference between the fifth binding energy BE5 and the sixth binding energy BE6 is 2.0 eV.

On the other hand, the fourth signal that is obtained by X-ray photoelectron spectroscopy of the third portion 13 includes the fourth peak pk4 at the seventh binding energy BE7. The fourth signal at the eighth binding energy BE8 is less than 20% of the intensity of the fourth peak pk4. The seventh binding energy BE7 is not less than 1114 eV and not more than 1123 eV. The seventh binding energy BE7 may be not less than 1118 eV and not more than 1119 eV. The seventh binding energy BE7 may be not less than 1117.5 eV and not more than 1119.5 eV. The eighth binding energy BE8 is lower than the seventh binding energy BE7. The absolute value of the difference between the seventh binding energy BE7 and the eighth binding energy BE8 is 2.0 eV.

For example, in the case where the first element includes In, in the X-ray photoelectron spectroscopy of at least a portion of the first portion 11, the signal strength at a binding energy of 443.3 eV is 20% or more of the signal strength at a binding energy of 445 eV. In the X-ray photoelectron spectroscopy of the third portion 13, the signal strength at a binding energy of 443.3 eV is less than 20% of the signal strength at a binding energy of 445 eV.

For example, in the case where the first element includes Ga, in the X-ray photoelectron spectroscopy of at least a portion of the first portion 11, the signal strength at a binding energy of 1116.2 eV is 20% or more of the signal strength at a binding energy of 1118.5 eV. In the X-ray photoelectron spectroscopy of the third portion 13, the signal strength at a binding energy of 1116.2 eV is less than 20% of the signal strength at a binding energy of 1118.5 eV.

An example of characteristics of the semiconductor device will now be described.

FIG. 4A to FIG. 4D are graphs illustrating characteristics of the semiconductor device.

Figure 4A:
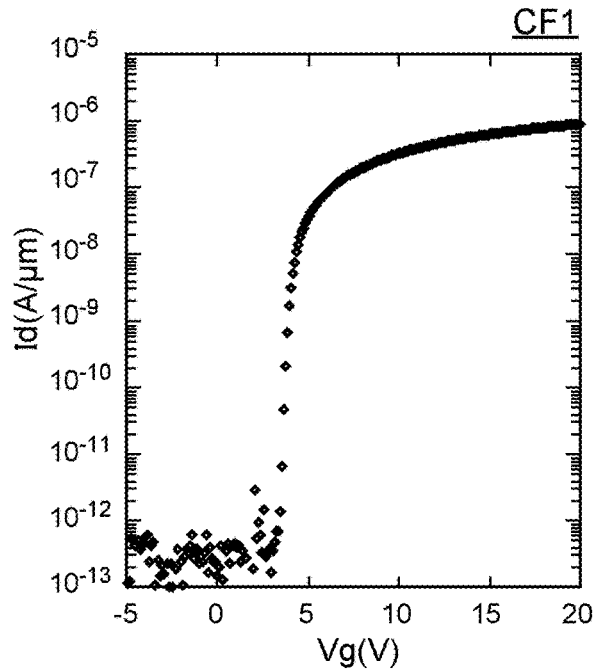
FIG. 4A to FIG. 4D are graphs illustrating characteristics of the semiconductor device.
Figure 4B:
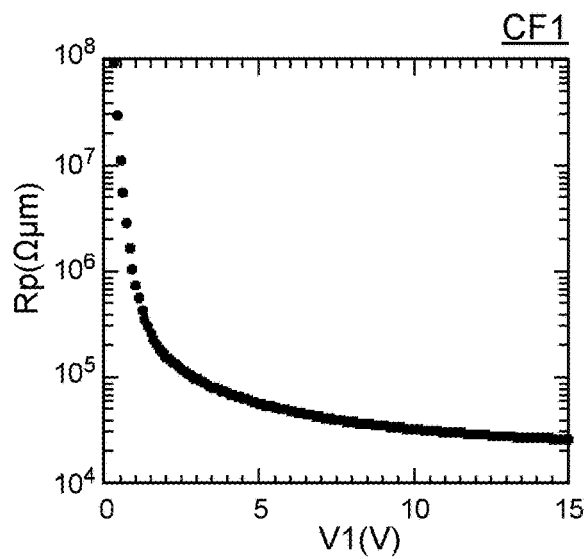
Figure 4C:
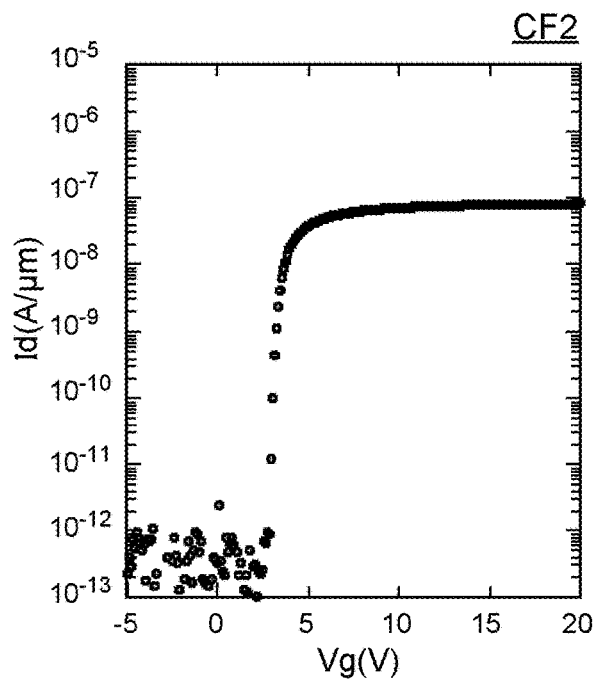
Figure 4D:
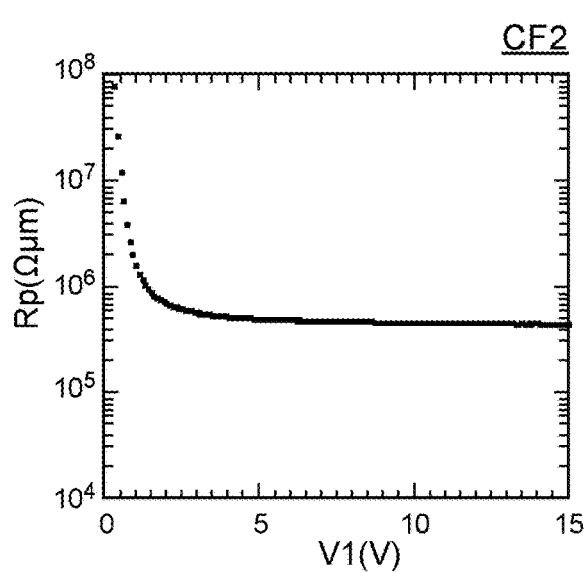

FIG. 4A and FIG. 4B correspond to a first configuration CF1. FIG. 4C and FIG. 4D correspond to a second configuration CF2. The first layer 31 and the second layer 32 are provided in the first configuration CF1. The first layer 31 and the second layer 32 are W films having thicknesses of 2 nm. The first layer 31 and the second layer 32 are not provided in the second configuration CF2. Otherwise, the configuration of the second configuration CF2 is similar to the first configuration CF1. In these configurations, the first electrode 51 and the second electrode 52 are ITO.

In FIG. 4A and FIG. 4C, the horizontal axis is a gate voltage Vg (V). In FIG. 4A and FIG. 4C, the vertical axis is a drain current Id (A/μm). In these figures, the gate width is 2.4 μm. The gate length is 0.8 μm. A drain voltage Vd is 0.05 V.

It can be seen by comparing FIG. 4A and FIG. 4C that the ON-current of the first configuration CF1 is larger than the ON-current of the second configuration CF2. The ON-current of the first configuration CF1 is 11 times the ON-current of the second configuration CF2.

In FIG. 4B and FIG. 4D, the horizontal axis is a gate overdrive voltage V1 (V). The gate overdrive voltage V1 is the difference between the gate voltage Vg and the threshold voltage. In FIG. 2B and FIG. 2D, the vertical axis is a parasitic resistance Rp (Ωμm). The parasitic resistance Rp is calculated from the relationship between the ON-resistance and the gate length.

It can be seen by comparing FIG. 4B and FIG. 4D that the parasitic resistance Rp of the first configuration CF1 is lower than the parasitic resistance Rp of the second configuration CF2. The parasitic resistance Rp of the first configuration CF1 is 1/17 of the parasitic resistance Rp of the second configuration CF2.

Thus, in the first configuration CF1, a large ON-current is obtained. A low parasitic resistance Rp is obtained.

Figure 5A:
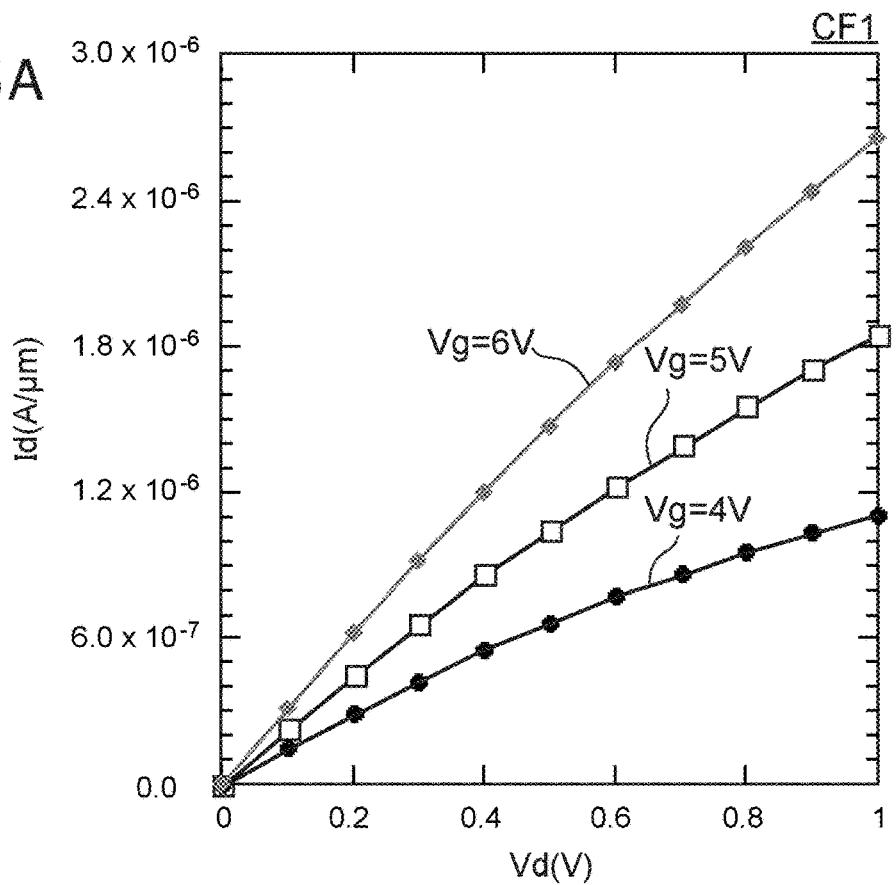
FIG. 5A and FIG. 5B are graphs illustrating characteristics of the semiconductor device.
Figure 5B:
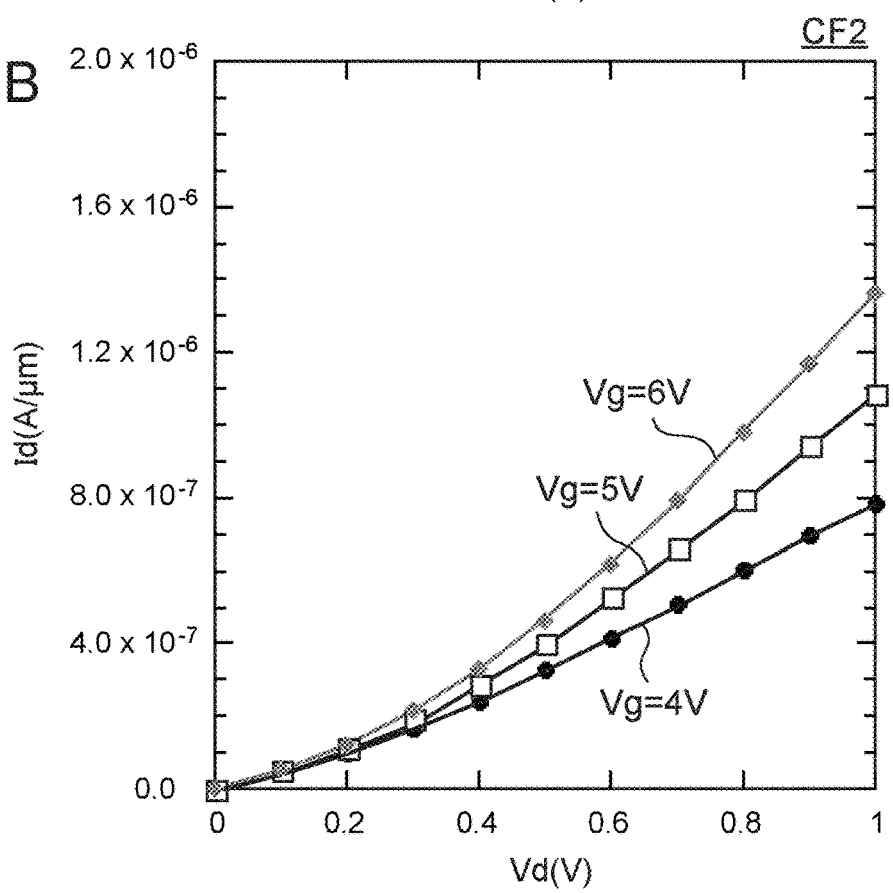

FIG. 5A and FIG. 5B are graphs illustrating characteristics of the semiconductor device.

FIG. 5A corresponds to the first configuration CF1. FIG. 5B corresponds to the second configuration CF2. In these figures, the horizontal axis is the drain voltage Vd (V). The vertical axis is the drain current Id (A/μm). In these figures, the characteristics when the gate voltage Vg is 4 V, 5 V, or 6 V are shown. In these figures, the gate width is 1.4 μm. The gate length is 0.8 μm.

Comparing FIG. 5A and FIG. 5B, it can be seen that the ohmic property is better for the first configuration CF1 than for the second configuration CF2. A good ohmic contact is obtained in the first configuration CF1. It is considered that this is due to the first layer 31 and the second layer 32 of the first configuration CF1.

Figure 6A:
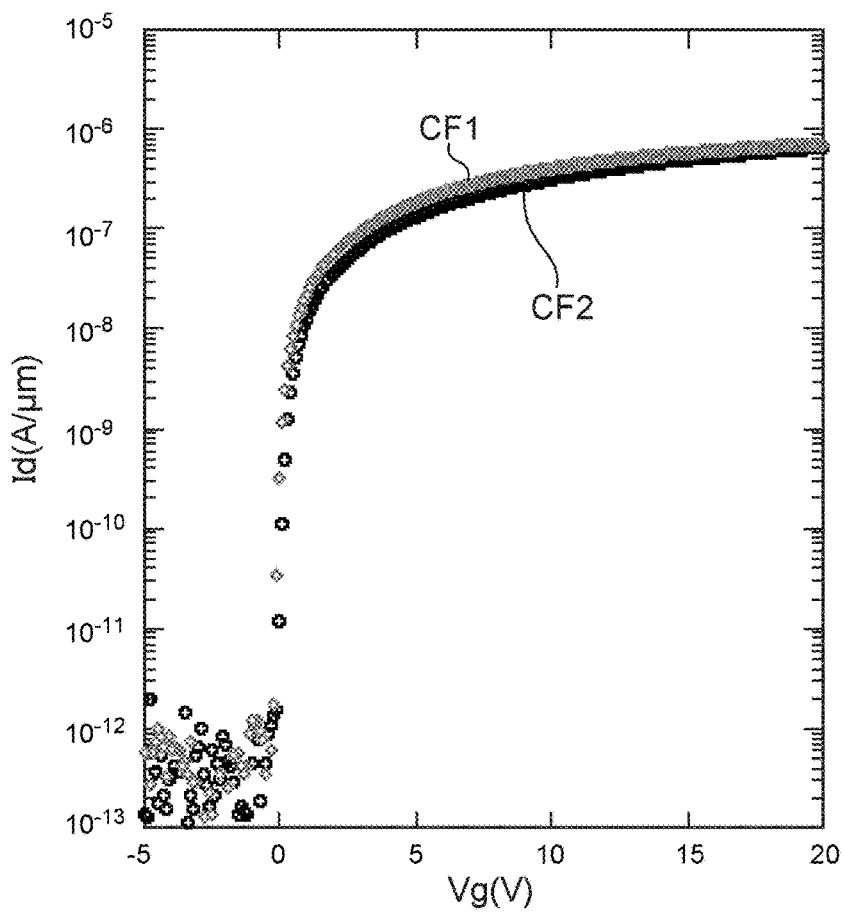
FIG. 6A and FIG. 6B are graphs illustrating characteristics of the semiconductor device.
Figure 6B:
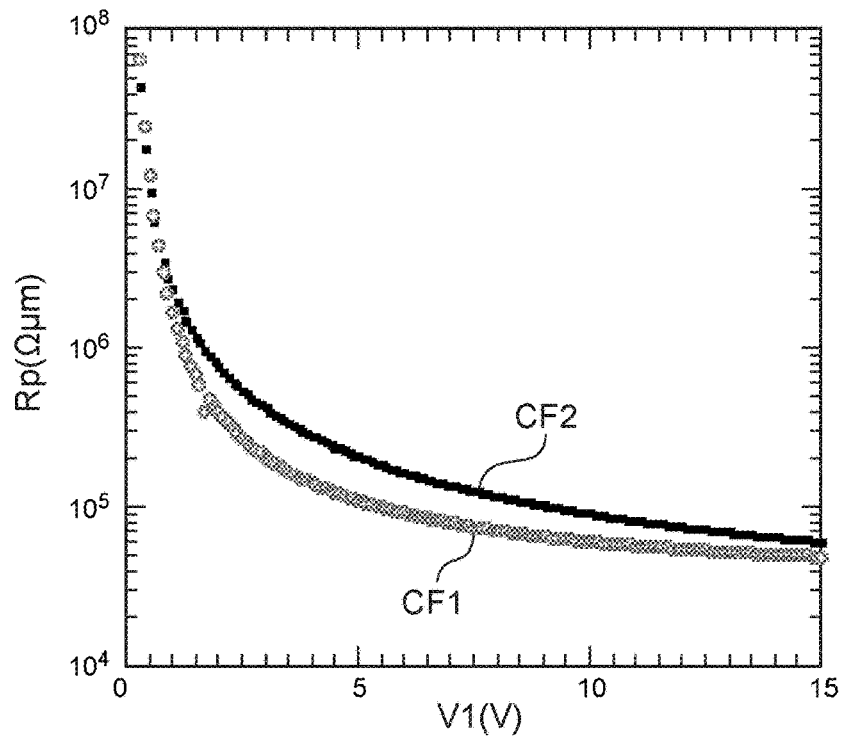

FIG. 6A and FIG. 6B are graphs illustrating characteristics of the semiconductor device.

These figures show the characteristics after heat treatment of the first configuration CF1 and the second configuration CF2 recited above is performed at 400° C. for 30 minutes. The horizontal axis of FIG. 6A is the gate voltage Vg (V). The vertical axis of FIG. 6A is the drain current Id (A/μm). The gate width is 2.4 μm. The gate length is 0.8 μm. The drain voltage Vd is 0.05 V.

Comparing the characteristic of the first configuration CF1 shown in FIG. 6A and the characteristic of the first configuration CF1 shown in FIG. 4A, a large drain current Id is obtained even after the heat treatment. It can be seen that good characteristics are maintained in the first configuration CF1 before the heat treatment and after the heat treatment.

On the other hand, comparing the characteristic of the second configuration CF2 shown in FIG. 6A and the characteristic of the second configuration CF2 shown in FIG. 4C, it can be seen that the drain current Id becomes large due to the heat treatment of the second configuration CF2.

The horizontal axis of FIG. 6B is the gate overdrive voltage V1 (V). The vertical axis of FIG. 6B is the parasitic resistance Rp ($\Omega\mu m$). Comparing the characteristic of the first configuration CF1 shown in FIG. 6B and the characteristic of the first configuration CF1 shown in FIG. 4B, it can be seen that a relatively low parasitic resistance is obtained even after the heat treatment.

On the other hand, comparing the characteristic of the second configuration CF2 shown in FIG. 6B and the characteristic of the second configuration CF2 shown in FIG. 4D, it can be seen that the parasitic resistance Rp can be reduced by performing the heat treatment of the second configuration CF2.

As shown in FIG. 6B, the parasitic resistance Rp of the first configuration CF1 is lower than the parasitic resistance Rp of the second configuration CF2 even after the heat treatment.

As described above, for the first configuration CF1 in which the first layer 31 and the second layer 32 are provided, good characteristics are obtained even after the heat treatment.

Figure 7:
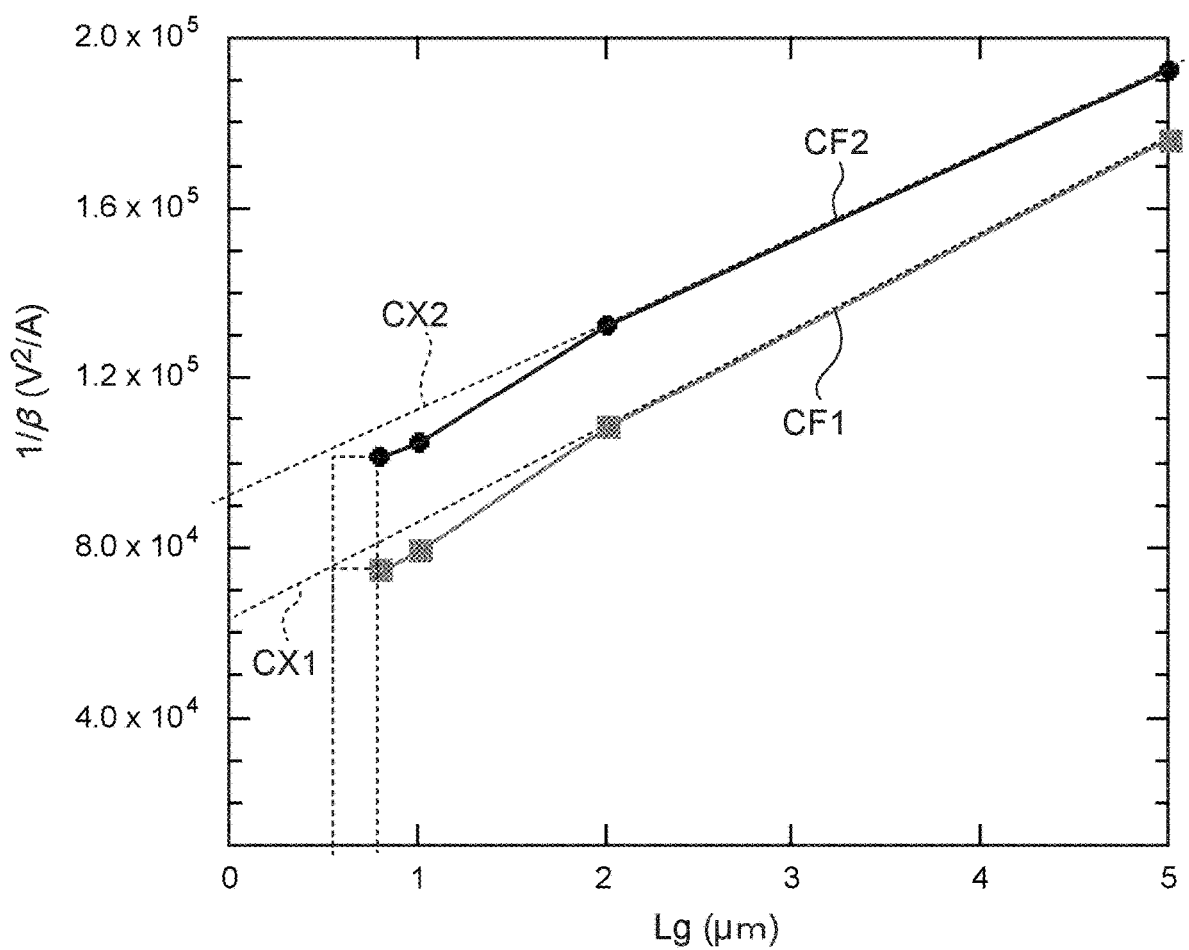
FIG. 7 is a graph illustrating characteristics of the semiconductor device.

FIG. 7 is a graph illustrating characteristics of the semiconductor device.

FIG. 7 shows an example of the change of a parameter $1/\beta$ when the gate length is modified for the first configuration CF1 and the second configuration CF2. The horizontal axis is a gate length Lg ($\mu m$). The vertical axis is the parameter $1/\beta$ ($V^2/A$). The parameter $1/\beta$ is a parameter corresponding to the slope of the voltage-current characteristic.

A solid line of the actual measured values of the first configuration CF1 and a solid line of the actual measured values of the second configuration CF2 are shown in FIG. 7. These solid lines are the characteristics after the heat treatment at 400° C. for 30 minutes. For the first configuration CF1 in FIG. 7, a broken line CX1 shows the characteristic when the characteristic (the straight line) is extended for the region where the gate length Lg is 2 $\mu m$ to 5 $\mu m$. Further, for the second configuration CF2 in FIG. 7, a broken line CX2 shows the characteristic when the characteristic (the straight line) is extended for the region where the gate length Lg is 2 $\mu m$ to 5 $\mu m$.

The difference between the solid line relating to the first configuration CF1 and the broken line CX1 corresponding to the first configuration CF1 corresponds to the effective reduction amount of the gate length. For the first configuration CF1, the effective reduction amount of the gate length is estimated to be 150 nm. It is considered that the effective reduction amount of the gate length corresponds to 2 times the length of the low-resistance region extending from the contact region. Accordingly, for the first configuration CF1, it is estimated that the length of one low-resistance region extending from the contact region is about 75 nm.

The difference between the solid line relating to the second configuration CF2 and the broken line CX2 corresponding to the second configuration CF2 corresponds to the effective reduction amount of the gate length. For the second configuration CF2 as well, the effective reduction amount of the gate length is estimated to be 150 nm.

It is considered that the spreading of the low-resistance region in the first configuration CF1 in which the first layer 31 and the second layer 32 are provided is equal to that of the second configuration CF2 in which the first layer 31 and the second layer 32 are not provided. The spreading of the low-resistance region in the first configuration CF1 is suppressed.

Figure 8:
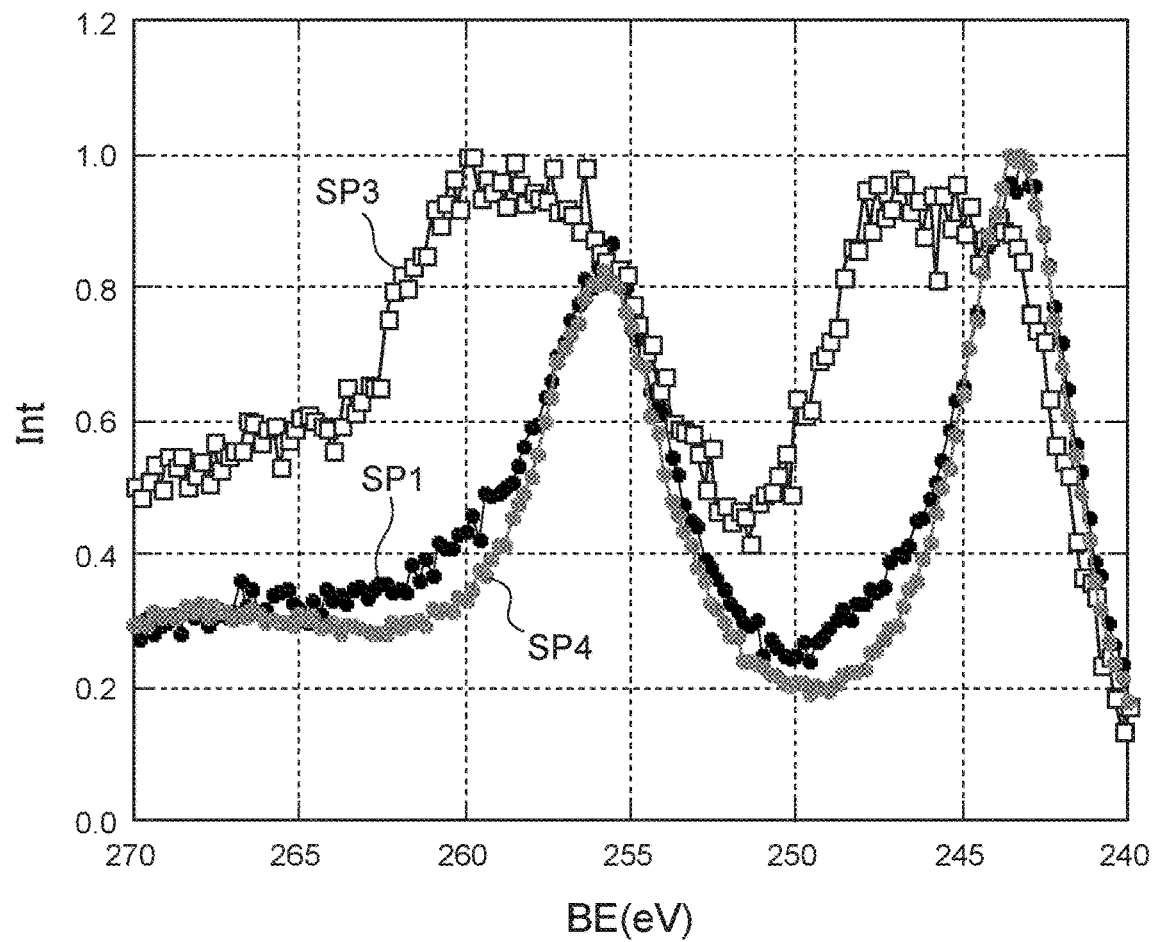
FIG. 8 is a graph illustrating characteristics of the semiconductor device.

FIG. 8 is a graph illustrating characteristics of the semiconductor device.

FIG. 8 illustrates the results of X-ray photoelectron spectroscopy (XPS) of the first sample SP1, a third sample SP3, and a fourth sample SP4. The horizontal axis corresponds to the binding energy BE (eV). The vertical axis corresponds to the intensity Int (arbitrary units) of the signal obtained. The results of FIG. 8 correspond to the analysis results of the region corresponding to the first layer 31.

In the first sample SP1, the semiconductor layer 10 is InGaZnO. The first layer 31 is a W film having a thickness of 2 nm. The first electrode 51 is ITO. The first sample SP1 is the sample before heat treatment at 400° C. for 30 minutes. The third sample SP3 is the first sample SP1 recited above after heat treatment at 400° C. for 30 minutes. The fourth sample SP4 is a W film as a reference; the W film is provided on a substrate of Si; and ITO (the first electrode 51) is not provided on the W film.

It can be seen from FIG. 8 that characteristics similar to the characteristics of the fourth sample SP4 including the W film as the reference are observed for the first sample SP1 in which the heat treatment is not performed. Peaks of the W—W bonds are observed for the first sample SP1 and the fourth sample SP4.

Conversely, peaks of W—O bonds are observed for the third sample SP3 after the heat treatment. Thus, a bond of the second element (e.g., W) and oxygen may be included in the first layer 31 of the sample after the heat treatment.

It is considered that the ratio of the metal and the oxide changes before and after the heat treatment. As described above, good characteristics are obtained before and after the heat treatment for the first configuration CF1 (one example according to the embodiment).

In the embodiment, the first layer 31 may include oxygen in addition to the second element (at least one selected from the group consisting of W, Ti, Ta, Mo, Cu, Al, Ag, Hf, Au, Pt, Pd, Ru, Y, V, Cr, Ni, Nb, In, Ga, Zn, and Sn). For example, the first layer 31 may include a bond of the second element and oxygen.

Third Embodiment

A semiconductor device according to the embodiment relates to a nonlinear element. For example, the characteristics of the nonlinear element respond nonlinearly to the applied voltage. For example, the nonlinear element has a rectifying characteristic. For example, such a nonlinear element can be used as the selector of a resistance random access memory element.

Figure 9:
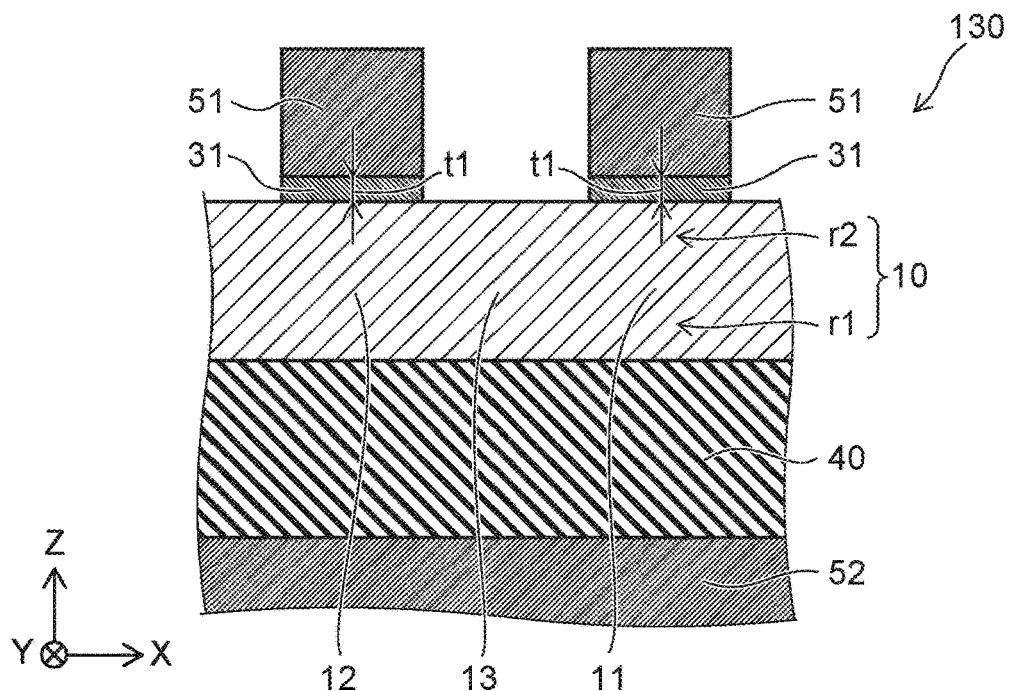
FIG. 9 is a schematic cross-sectional view illustrating the semiconductor device according to the third embodiment.

FIG. 9 is a schematic cross-sectional view illustrating the semiconductor device according to the third embodiment.

As shown in FIG. 9, the semiconductor device 130 according to the embodiment further includes the second electrode 52 and an intermediate layer 40 in addition to the semiconductor layer 10, the first layer 31, and the first electrode 51.

The first portion 11 of the semiconductor layer 10 is provided between the second electrode 52 and the first electrode 51 in the first direction (the Z-axis direction). The first layer 31 is provided between the first portion 11 and the first electrode 51 in the first direction. The intermediate layer 40 is provided between the second electrode 52 and the semiconductor layer 10 in the first direction.

For example, the first region r1 is provided between the intermediate layer 40 and the first layer 31 in the first direction. The second region r2 is provided between the first region r1 and the first layer 31 in the first direction. In such a case as well, the first region r1 includes a bond of the first element and oxygen (e.g., an In—O bond, etc.). The second region r2 includes a bond of the first element and a metallic element (e.g., an In—In bond, etc.). Thereby, good contacts are obtained.

For example, the electrical resistance between the first electrode 51 and the second electrode 52 changes according to the voltage applied between the first electrode 51 and the second electrode 52. The electrical resistance of the intermediate layer 40 changes according to the voltage applied between the first electrode 51 and the second electrode 52. The intermediate layer 40 is, for example, a variable resistance layer. The intermediate layer 40 may include, for example, a phase-change variable resistance layer.

The semiconductor layer 10 may include a portion (e.g., the second portion 12, the third portion 13, etc.) not overlapping the first layer 31 in the first direction. For example, the third portion 13 is provided between the first portion 11 and the second portion 12 in the X-axis direction. For example, another first electrode 51 and another first layer 31 that correspond to the second portion 12 are provided. For example, a portion corresponding to one of the multiple first electrodes 51 may operate as one memory element. A portion corresponding to another one of the multiple first electrodes 51 may operate as another one memory element. The third portion 13 corresponds to a region between the two elements.

For example, the thickness t1 of the first layer 31 is not excessively thick. The thickness t1 of the first layer 31 is not less than 0.5 nm but less than 5 nm. For example, the thickness t1 of the first layer 31 may be not less than 0.5 nm but less than 3 nm. Because the thickness t1 of the first layer 31 is not excessively thick, excessive spreading of the low-resistance region in the third portion 13 can be suppressed. Thereby, independent operations of the multiple memory elements are easy.

According to the embodiment, a semiconductor device can be provided in which the characteristics can be improved.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, layers, intermediate layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor layer including a first portion including a first element and oxygen, the first element including at least one selected from the group consisting of In, Ga, and Zn; and
   a first layer including a second element including at least one selected from the group consisting of W, Ti, Ta, Mo, Cu, Al, Ag, Hf, Au, Pt, Pd, Ru, Y, V, Cr, Ni, Nb, and Sn,
   the first portion including a first region and a second region,
   the second region being provided between the first region and the first layer,
   the first region including a bond of the first element and oxygen,
   the second region including a bond of at least one selected from the group consisting of In—In, Ga—Ga, In—Ga, In—Zn, and Ga—Zn,
   a thickness of the first layer along a first direction being not less than 0.5 nm but less than 3 nm, the first direction being from the first portion toward the first layer.

2. The device according to claim 1, wherein the second region includes the bond of the first element and oxygen.

3. The device according to claim 1, wherein
   the first element includes In, and
   a first signal obtained by X-ray photoelectron spectroscopy of the second region includes a first peak at a first binding energy, the first signal at a second binding energy being 20% or more of an intensity of the first peak, the first binding energy being not less than 444 eV and not more than 446 eV, the second binding energy being lower than the first binding energy, an absolute value of a difference between the first binding energy and the second binding energy being 1.5 eV.

4. The device according to claim 3, wherein a second signal obtained by the X-ray photoelectron spectroscopy of the first region includes a second peak at a third binding energy, the second signal at a fourth binding energy being less than 20% of an intensity of the second peak, the third binding energy being not less than 444 eV and not more than 446 eV, the fourth binding energy being lower than the third binding energy, an absolute value of a difference between the third binding energy and the fourth binding energy being 1.5 eV.

5. The device according to claim 1, wherein
the first element includes Ga, and
a third signal obtained by X-ray photoelectron spectroscopy of the second region includes a third peak at a fifth binding energy, the third signal at a sixth binding energy being 20% or more of an intensity of the third peak, the fifth binding energy being not less than 1118 eV and not more than 1119 eV, the sixth binding energy being lower than the fifth binding energy, an absolute value of a difference between the fifth binding energy and the sixth binding energy being 2.0 eV.

6. The device according to claim 5, wherein a fourth signal obtained by the X-ray photoelectron spectroscopy of the first region includes a fourth peak at a seventh binding energy, the fourth signal at an eighth binding energy being less than 20% of an intensity of the fourth peak, the seventh binding energy being not less than 1118 eV and not more than 1119 eV, the eighth binding energy being lower than the seventh binding energy, an absolute value of a difference between the seventh binding energy and the eighth binding energy being 2.0 eV.

7. The device according to claim 1, wherein an oxygen concentration in the second region is lower than an oxygen concentration in the first region.

8. The device according to claim 1, wherein a binding energy of the second element with oxygen is higher than a binding energy of the first element with oxygen.

9. The device according to claim 1, wherein the first layer includes oxygen.

10. The device according to claim 1, wherein the first layer includes a bond of the second element and oxygen.

11. The device according to claim 1, further comprising a first electrode,
the first layer being provided between the first portion and the first electrode in the first direction,
the first electrode includes at least one selected from the group consisting of a first oxide, Au, Pt, and Pd,
the first oxide including an oxide including at least one element selected from the group consisting of In, Sn, Zn, and Ti.

12. The device according to claim 11, further comprising:
a second layer;
a second electrode;
a third electrode; and
an insulating portion including a first insulating region,
the semiconductor layer further including a second portion and a third portion,
a second direction from the first electrode toward the second electrode crossing the first direction,
a position in the second direction of at least a portion of the third electrode being between a position in the second direction of at least a portion of the first electrode and a position in the second direction of at least a portion of the second electrode,
a direction from the first portion toward the second portion being aligned with the second direction,
the second layer being provided between the second portion and the second electrode in the first direction,
the first insulating region being between the third electrode and the third portion in the first direction.

13. The device according to claim 12, wherein
the second portion includes a third region and a fourth region,
the fourth region is provided between the third region and the second layer,
the third region includes a bond of the first element and oxygen,
the fourth region includes a bond of the first element and a metallic element, and
a thickness of the second layer along a direction from the second portion toward the second layer is not less than 0.5 nm but less than 3 nm.

14. The device according to claim 13, wherein the second layer includes at least one selected from the group consisting of W, Ti, Ta, Mo, Cu, Al, Ag, Hf, Au, Pt, Pd, Ru, Y, V, Cr, Ni, Nb, In, Ga, Zn, and Sn.

15. The device according to claim 12, wherein
the second electrode includes at least one selected from the group consisting of a second oxide, Au, Pt, and Pd, and
the second oxide includes an oxide including at least one element selected from the group consisting of In, Sn, Zn, and Ti.

16. The device according to claim 12, wherein a position in the first direction of the first portion is between a position in the first direction of the third electrode and a position in the first direction of the first layer.

17. The device according to claim 11, further comprising:
a second electrode; and
an intermediate layer,
the first portion being provided between the second electrode and the first electrode in the first direction,
the intermediate layer being provided between the second electrode and the semiconductor layer in the first direction.

18. The device according to claim 17, wherein an electrical resistance between the first electrode and the second electrode changes according to a voltage applied between the first electrode and the second electrode.

19. The device according to claim 1, wherein the first element further includes at least one selected from the group of Al, Sn, Ti, Si, Ge, Cu, As, and W.

20. A semiconductor device comprising:
a semiconductor layer including a first portion including a first element and oxygen, the first element including at least one selected from the group consisting of In, Ga, Zn, Al, Sn, Ti, Si, Ge, Cu, As, and W; and
a first layer including a second element including at least one selected from the group consisting of W, Ti, Ta, Mo, Cu, Al, Ag, Hf, Au, Pt, Pd, Ru, Y, V, Cr, Ni, Nb, In, Ga, Zn, and Sn,
the first portion including a first region and a second region,
the second region being provided between the first region and the first layer,
the first region including a bond of the first element and oxygen,
the second region including a bond of the first element and a metallic element, a thickness of the first layer along a first direction being not less than 0.5 nm but less than 3 nm, the first direction being from the first portion toward the first layer, wherein the first element includes In, and wherein a first signal obtained by X-ray photoelectron spectroscopy of the second region includes a first peak at a first binding energy, the first signal at a second binding energy being 20% or more of an intensity of the first peak, the first binding energy being not less than 444 eV and not more than 446 eV, the second binding energy being lower than the first binding energy, and an absolute value of a difference between the first binding energy and the second binding energy being 1.5 eV.

21. A semiconductor device comprising:

a semiconductor layer including a first portion including a first element and oxygen, the first element including at least one selected from the group consisting of In, Ga, Zn, Al, Sn, Ti, Si, Ge, Cu, As, and W; and a first layer including a second element including at least one selected from the group consisting of W, Ti, Ta, Mo, Cu, Al, Ag, Hf, Au, Pt, Pd, Ru, Y, V, Cr, Ni, Nb, In, Ga, Zn, and Sn, the first portion including a first region and a second region, the second region being provided between the first region and the first layer, the first region including a bond of the first element and oxygen, the second region including a bond of the first element and a metallic element, a thickness of the first layer along a first direction being not less than 0.5 nm but less than 3 nm, the first direction being from the first portion toward the first layer, wherein the first element includes Ga, and wherein a third signal obtained by X-ray photoelectron spectroscopy of the second region includes a third peak at a fifth binding energy, the third signal at a sixth binding energy being 20% or more of an intensity of the third peak, the fifth binding energy being not less than 1118 eV and not more than 1119 eV, the sixth binding energy being lower than the fifth binding energy, an absolute value of a difference between the fifth binding energy and the sixth binding energy being 2.0 eV.

* * * * *